United States Patent
Anderson et al.

(10) Patent No.: US 6,293,637 B1
(45) Date of Patent: Sep. 25, 2001

(54) EARTHQUAKE-RESISTANT ELECTRONIC EQUIPMENT FRAME

(75) Inventors: Thomas E. Anderson, South Barrington; Jerry L. Young, Lockport; Glenn Dickson, Palatine; Louis A. Derango, Des Plaines, all of IL (US)

(73) Assignee: Amco Engineering Co., Schiller Park, IL (US)

( * ) Notice: Subject to any disclaimer, the term of this patent is extended or adjusted under 35 U.S.C. 154(b) by 0 days.

(21) Appl. No.: 09/569,507

(22) Filed: May 12, 2000

(51) Int. Cl.[7] .................................................. A47B 47/00
(52) U.S. Cl. ..................... 312/265.1; 312/265.4; 211/26
(58) Field of Search ............................. 312/265.1, 265.2, 312/265.3, 265.4, 265.5, 265.6, 257.1, 263, 140, 111, 264; 361/724, 725; 211/26, 182, 189, 191; 52/653.1, 653.2

(56) References Cited

U.S. PATENT DOCUMENTS

| | | |
|---|---|---|
| 2,508,032 | 5/1950 | Kennedy . |
| 3,034,844 | 5/1962 | Anderson et al. ............... 312/257.1 |
| 3,487,948 | 1/1970 | Haidegger . |
| 4,074,811 | 2/1978 | Filak ................................. 211/191 |
| 4,153,164 | 5/1979 | Hofmeister et al. . |
| 4,447,856 | 5/1984 | Takahashi et al. . |
| 4,464,074 | 8/1984 | Green et al. . |
| 4,496,057 | 1/1985 | Zenitani et al. ....................... 211/26 |
| 4,497,411 | 2/1985 | DeBortoli .............................. 211/26 |
| 4,531,640 | 7/1985 | Shah ............................... 211/189 X |
| 4,715,502 | 12/1987 | Salmon ................................. 211/26 |
| 4,754,369 | 6/1988 | Nilsson .............................. 312/257.1 |
| 4,899,892 | 2/1990 | Rheault ............................. 211/26 X |
| 5,004,107 | 4/1991 | Sevier et al. ........................... 211/26 |
| 5,165,770 | 11/1992 | Hahn ............................... 312/265.4 |
| 5,228,762 | 7/1993 | Mascrier .......................... 312/265.4 |
| 5,233,129 | 8/1993 | Hall .................................... 174/52.1 |
| 5,250,752 | 10/1993 | Cutright ...................... 312/265.4 X |
| 5,292,189 | 3/1994 | Lau et al. ......................... 312/265.3 |
| 5,323,916 | 6/1994 | Salmon ................................. 211/26 |
| 5,372,262 | 12/1994 | Benson et al. ........................ 211/26 |
| 5,380,083 | 1/1995 | Jones et al. ..................... 312/265.3 |
| 5,383,723 | 1/1995 | Meyer ............................. 312/265.4 |
| 5,443,312 | 8/1995 | Schluter ......................... 312/334.27 |
| 5,497,591 | 3/1996 | Nelson .............................. 52/481.1 |
| 5,536,079 | 7/1996 | Kostic ............................. 312/265.3 |
| 5,619,837 | 4/1997 | DiSanto ............................ 52/798.1 |
| 5,639,150 | 6/1997 | Anderson et al. ............... 312/265.3 |
| 5,769,519 | 6/1998 | Nicolai ......................... 312/265.4 X |
| 5,806,946 | 9/1998 | Benner et al. ................ 312/265.4 X |
| 5,819,956 | 10/1998 | Rinderer .............................. 211/26 |
| 5,979,672 | 11/1999 | Gemra et al. ......................... 211/26 |

FOREIGN PATENT DOCUMENTS

| | | | |
|---|---|---|---|
| 642359 | * 6/1962 | (CA) | ................................. 312/265.4 |
| 2631976 | * 1/1978 | (DE) | ................................. 312/265.4 |
| 2074386 | 10/1981 | (GB) | . |
| 2095101 | * 9/1982 | (GB) | ................................. 312/265.4 |

* cited by examiner

*Primary Examiner*—Peter M. Cuomo
*Assistant Examiner*—James O. Hansen
(74) *Attorney, Agent, or Firm*—Marshall, O'Toole Gerstein, Murray & Borun

(57) ABSTRACT

An open frame-type electronic frame in which the two sides are each formed of two separate corrugated channel members rigidly connected by a series of cross struts having specially configured bent tang ends and heavy duty offset weld joints.

11 Claims, 8 Drawing Sheets

FIG. 3
FIG. 4
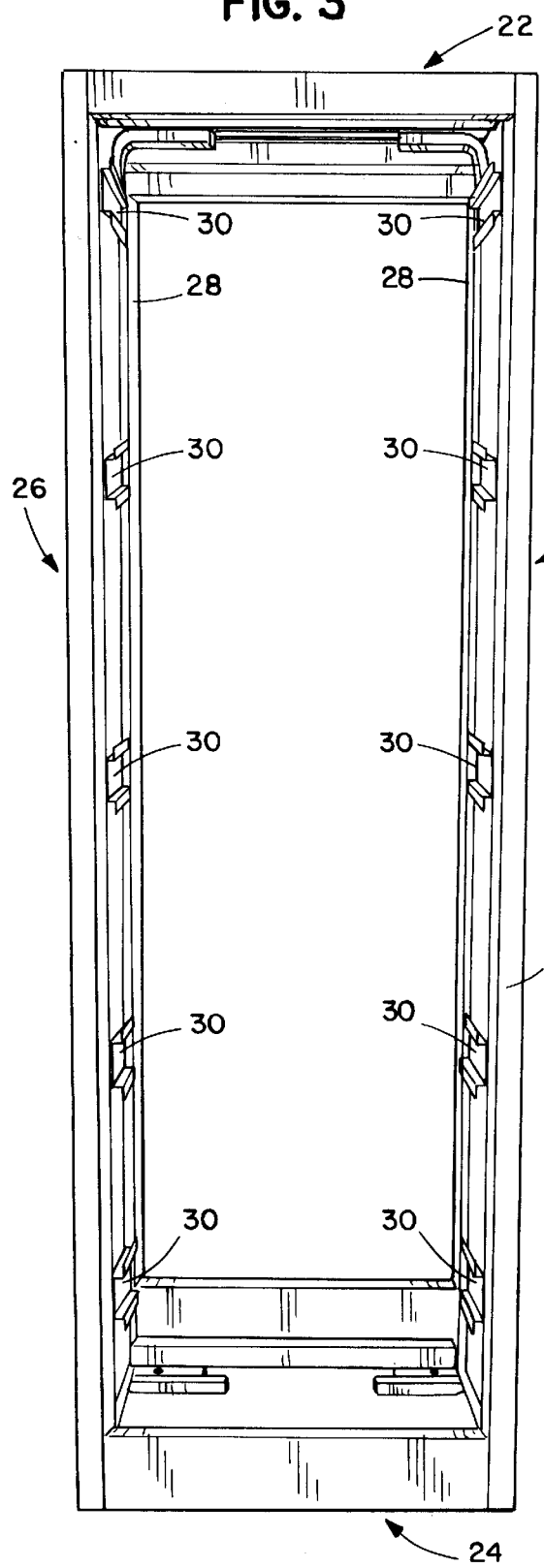
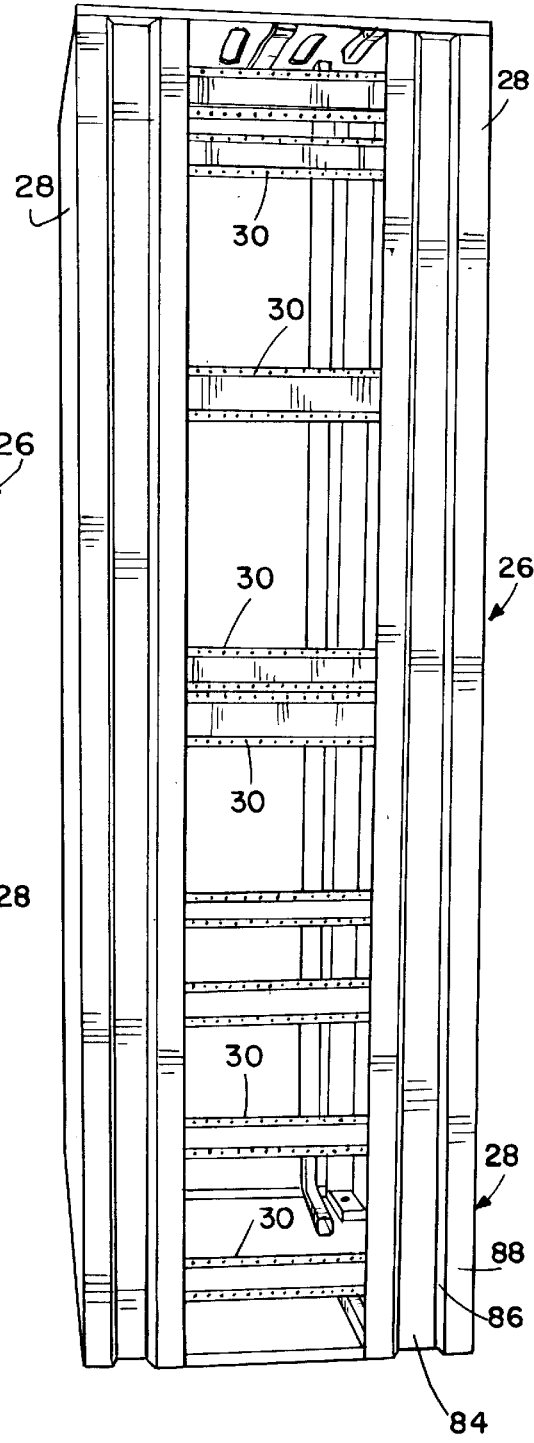

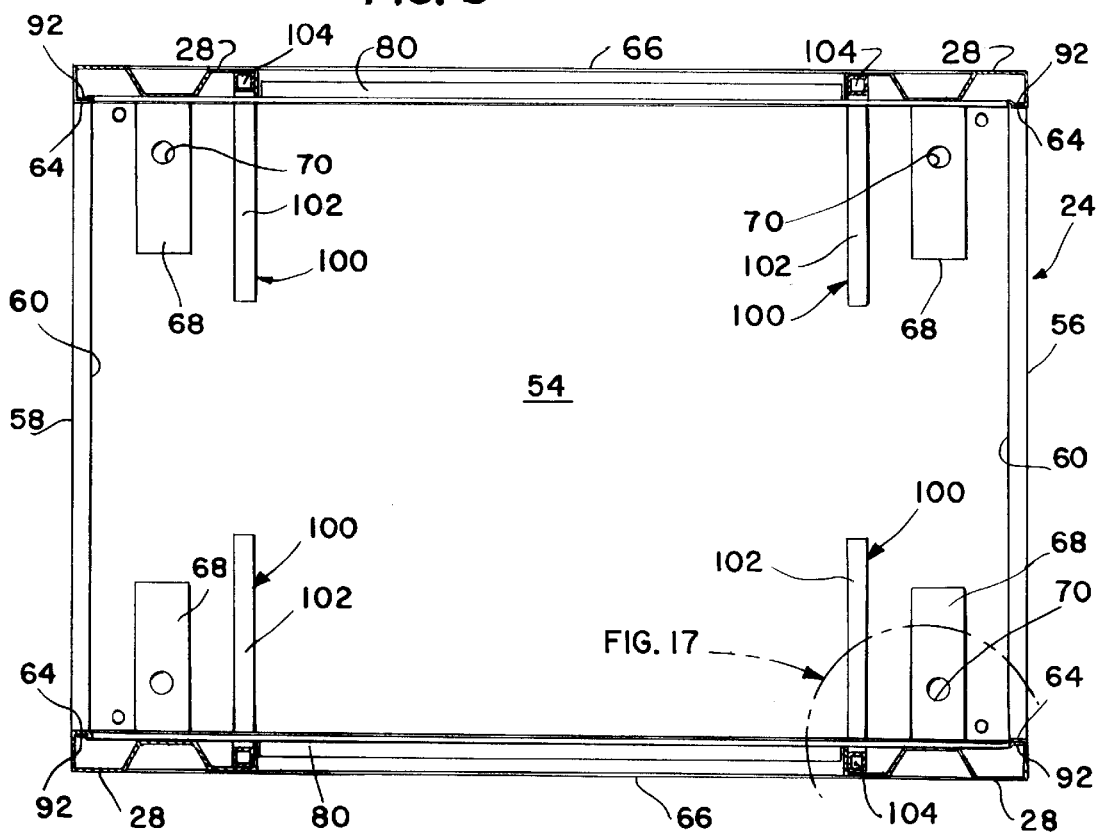
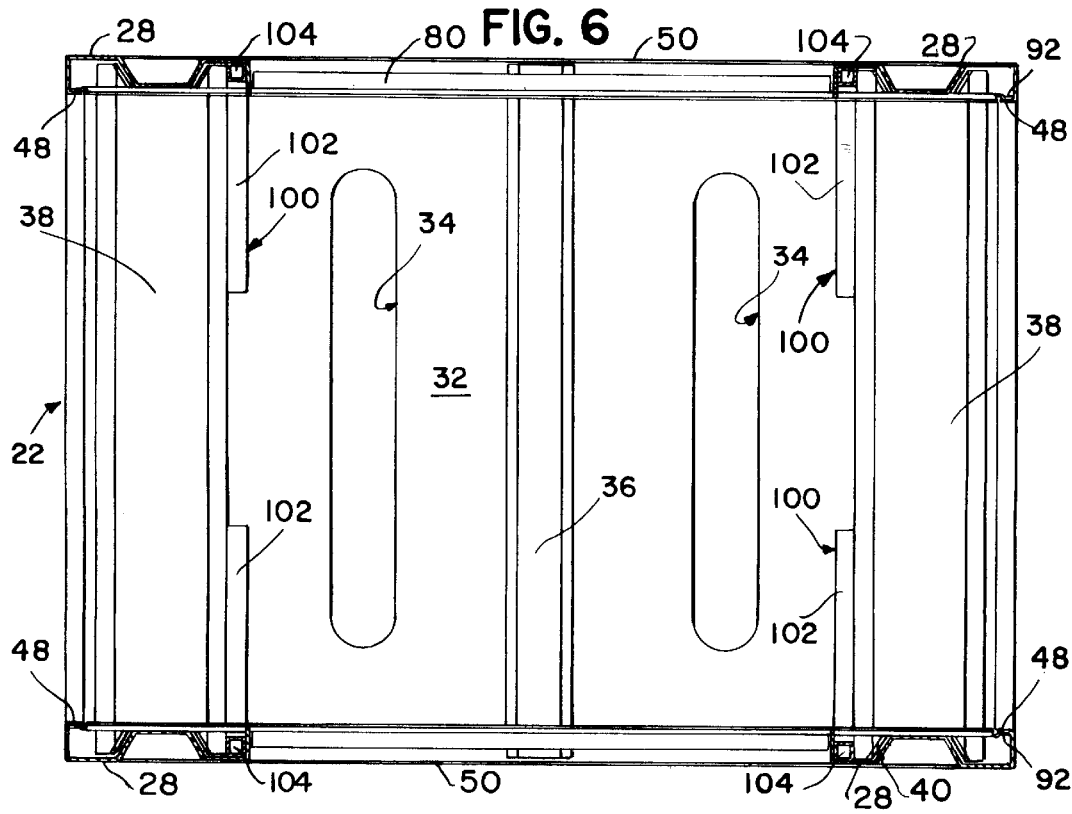

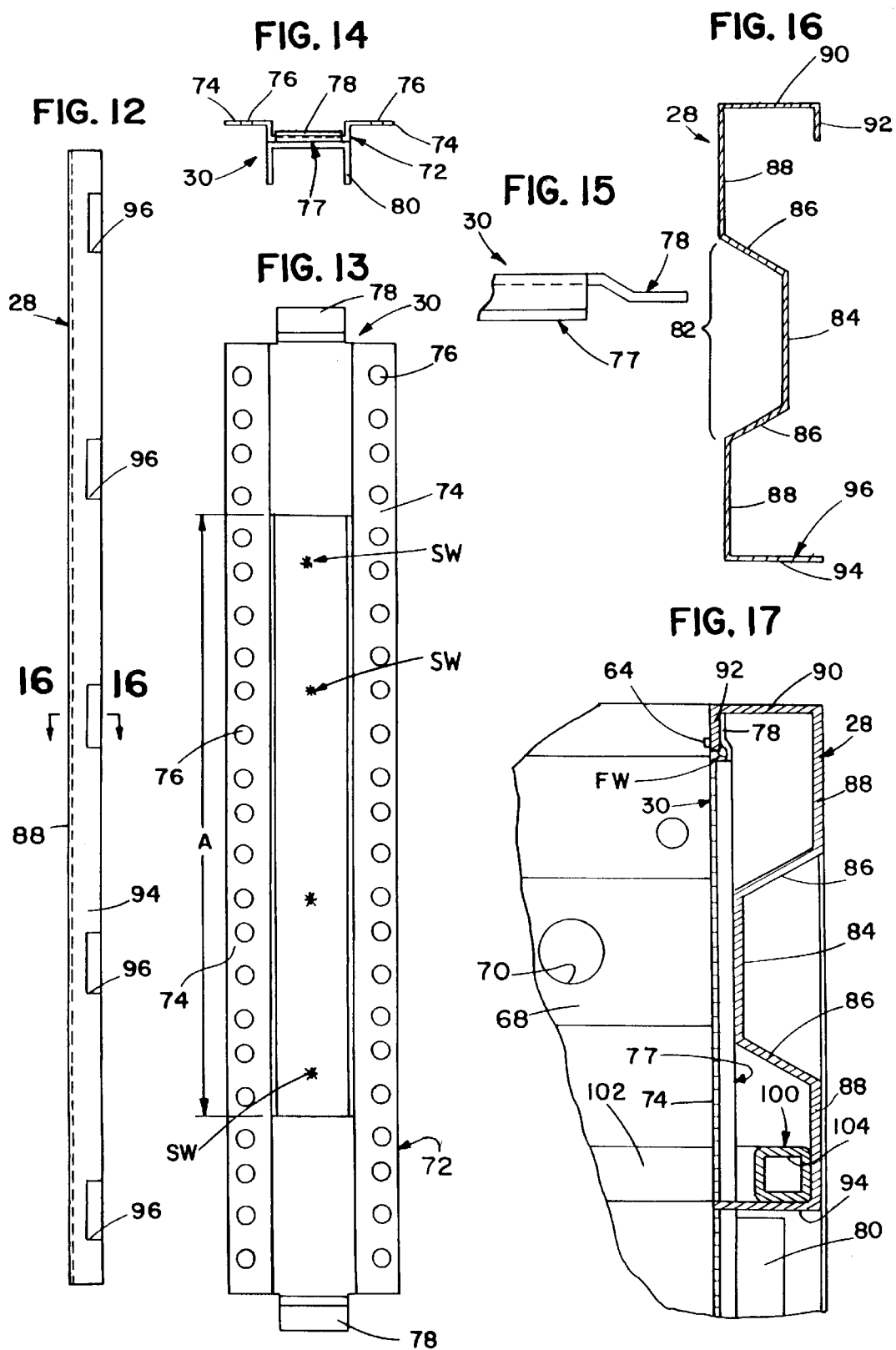

US 6,293,637 B1

EARTHQUAKE-RESISTANT ELECTRONIC EQUIPMENT FRAME

FIELD OF THE INVENTION

This invention relates to electronic equipment frames and enclosures, and particularly ones that are resistant to damage from earthquakes and other tremor-related activity.

BACKGROUND OF THE INVENTION

Electronic equipment enclosures, whether of the skeletal frame-type or full cabinet-type, are used for housing electronic equipment, telecommunication switching gear, computer servers, and similar electronic devices. There is an ever increasing need for such electronic equipment enclosures to be so-called "earthquake resistant" or "fault tolerant". That is, for many locations, they must be designed to withstand high vibratory stresses in three axes, such as are present in earthquake prone locations, military installations, and similar sites. Such high strength is needed to keep the equipment frames and enclosures from going into harmonic vibration which can lead to self destruction, and to withstand high cantilever lateral loads. An industry standard, known as the so-called Seismic Zone 4 standard (issued as the Bellcore Specification NEBS, GR-63-CORE, Issue 1) has been developed for such enclosures. Successful testing to that standard is used by manufacturers of such earthquake resistant electronic enclosures to claim that are Seismic Zone 4 compliant. Such Seismic 4 testing assures sufficient resistance to torsional loads, lateral loads, vibratory loads, and other severe tremor-created conditions.

One prior attempt to create an earthquake-resistant electronic equipment enclosure is U.S. Pat. No. 5,979,672 (Gemra, et al). That electronic equipment enclosure has a unitized or monocoque-type enclosure formed of one continuous corrugated panel, i.e., with all the side, top, and bottom sections formed of corrugated metal. In effect, the connected (or continuous folded) corrugated panels provide a continuous envelope for the structure. However, there are practical difficulties in trying to economically manufacture such an enclosure. Further, there is no side access permitted with that frame design, plus the fastening and mounting locations for the equipment shelves are severely limited.

SUMMARY OF THE INVENTION

The present invention comprises an open frame-type electronic frame in which the two sides are each formed of two separate corrugated channel members rigidly connected by a series of cross struts having specially configured bent tang ends and heavy duty offset weld joints. Importantly, each respective corrugated side channel member has a central generally, V-shaped, flat-bottomed trough portion, flat wall extension portions, and two outer, substantially equal length end flanges, with one having a bent lip portion. The lipless flange is notched at several locations along its length to permit assembly and rigid fastening of the respective cross strut members. A top panel member has two corrugated channel members having the same central corrugation profile as that of the side channel members. These top channel members are rigidly affixed, such as by welding, along their length to the underneath side of the top panel member, and at their respective ends to the side channel members. The top panel assembly also includes at least one cable access opening, along with an associated top panel stiffener member, to permit ready access of cable to the electronic equipment housed in the present frame. The bottom panel assembly is a generally U-shaped flat panel member formed without any corrugated channel members, or other cross stiffener members. Anchor plates are provided.

Further, eight separate generally L-shaped bent tube sections are rigidly affixed, such as by welding, a series of four each respectively to the top panel and side members adjacent the side corrugated channel members, and similarly, another series of four each to the lower side wall and bottom panel, again adjacent the side corrugated channel members. They provide the needed bi-axial stress relief to the overall frame. Thus, the resultant equipment frame is lightweight, as compared to prior art earthquake-resistant frames, and is formed of welded-up components, including use of corrugated supports at only the four vertical corners of the frame.

Additionally, if desired, standard-sized front and rear panel doors and side panels (i.e., so-called "skins") and shelves can be added to the present frame so as to create a full cabinet-type enclosure. However, such additional doors and side panels are not believed needed to satisfactorily pass the Seismic Zone 4 test protocol.

BRIEF DESCRIPTION OF THE DRAWINGS

The means by which the foregoing and other aspects of the present invention are accomplished and the manner of their accomplishment will be readily understood from the following specification upon reference to the accompanying drawings, in which:

FIG. 3 is a front elevation view of the frame of FIG. 1;

FIG. 4 is a side elevation view of the frame of FIG. 1 (with the opposite side view being a mirror image thereof);

FIG. 5 is a cross section view, viewed along lines 5—5 of FIG. 2, showing the corrugated side channel members and various bottom panel assembly components for the frame of FIG. 1;

FIG. 6 is a cross section view, viewed along lines 6—6 of FIG. 2, showing the corrugated side channel members and various top panel assembly components for the frame of FIG. 1;

FIG. 12 is a reduced-size side elevation view of a corrugated side channel member of the present frame;

FIG. 13 is an enlarged front elevation view of the side cross strut member (viewed as rotated 90°);

FIG. 14 is an end elevation view of the cross strut of FIG. 14 showing the bent tang end component;

FIG. 15 is a fragmented end view of the cross strut of FIG. 13, showing the bent tang end structure;

FIG. 16 is an enlarged cross section view of the corrugated side channel member of FIG. 12;

FIG. 17 is an enlarged fragmented bottom plan view of a lower corner of the frame, taken from FIG. 5;

DETAILED DESCRIPTION OF THE PREFERRED EMBODIMENT

Figure 1:
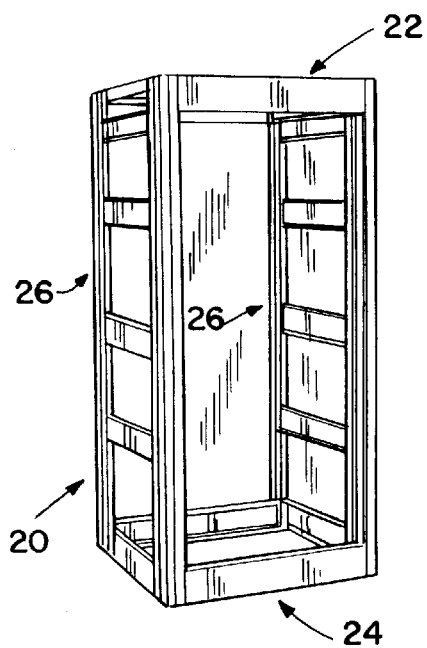
FIG. 1 is a reduced-size front perspective view of the earthquake resistant electronic equipment frame of the present invention.

Having reference to the drawings, wherein like reference numerals indicate corresponding elements, there is shown in FIG. 1 an illustration of the earthquake resistant electronic equipment frame of the present invention, generally denoted by reference numeral 20. The frame 20 comprises a top panel assembly 22, a bottom panel assembly 24, and two respective side assemblies 26. All are preferably formed of welded-up metal components, such as formed, i.e., bent-up, cold rolled sheet steel.

Figure 2:
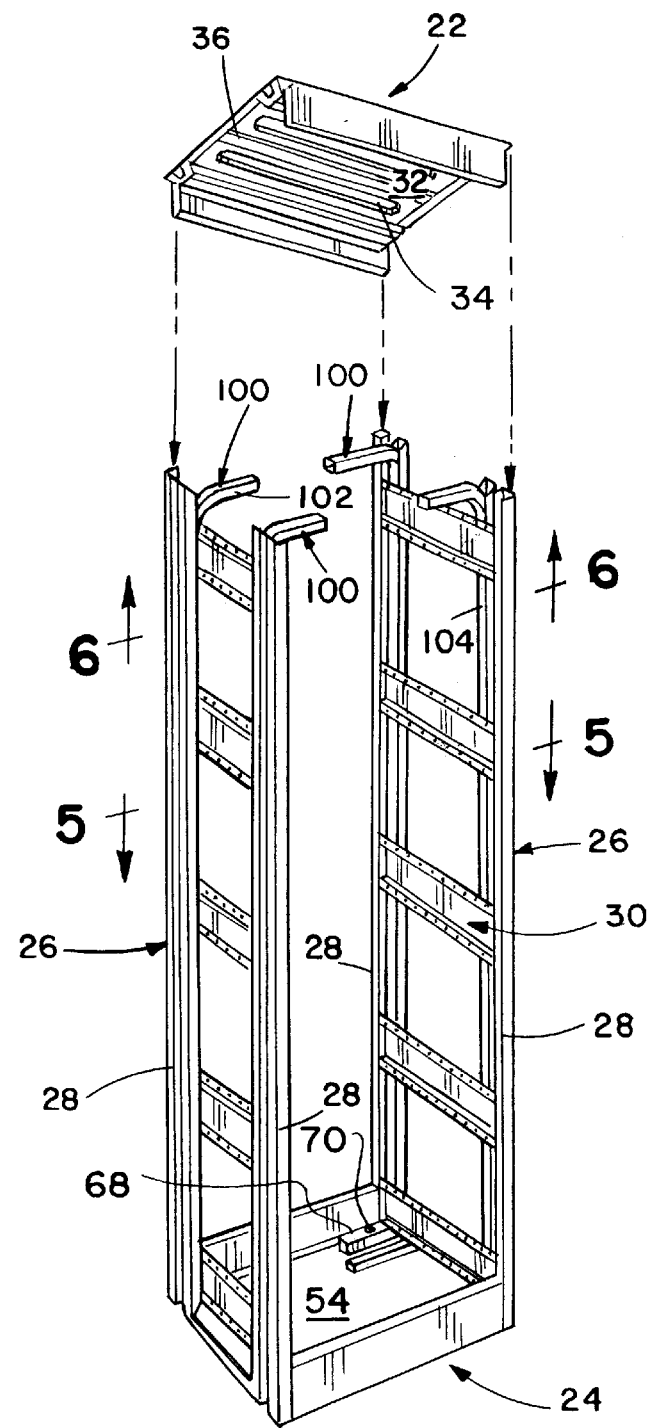
FIG. 2 is an exploded assembly view of the frame of FIG. 1.

As best seen in FIGS. 2–4, each side assembly 26 is an integral unit and includes two primary supports in the form of specially-configured corrugated side channel members 28, and a series of cross strut assemblies 30 each of which is rigidly affixed at its respective ends which are specially configured, through a preferred special weld joint (both discussed later herein), to the respective side channel members 28.

The top panel assembly 22 includes, see FIG. 6, a top panel member 32 (preferably formed of 14 gauge sheet steel material) having a pair of elongated equipment wiring access openings 34, a generally U-shaped panel stiffener member 36 between openings 34, and two corrugated channel members 38. Channel members 38 are preferably formed of 14 gauge sheet steel. The stiffener 36 and two channel members 38 are rigidly affixed to the underneath side of panel member 32 by welding along their respective sides.

Figure 7:
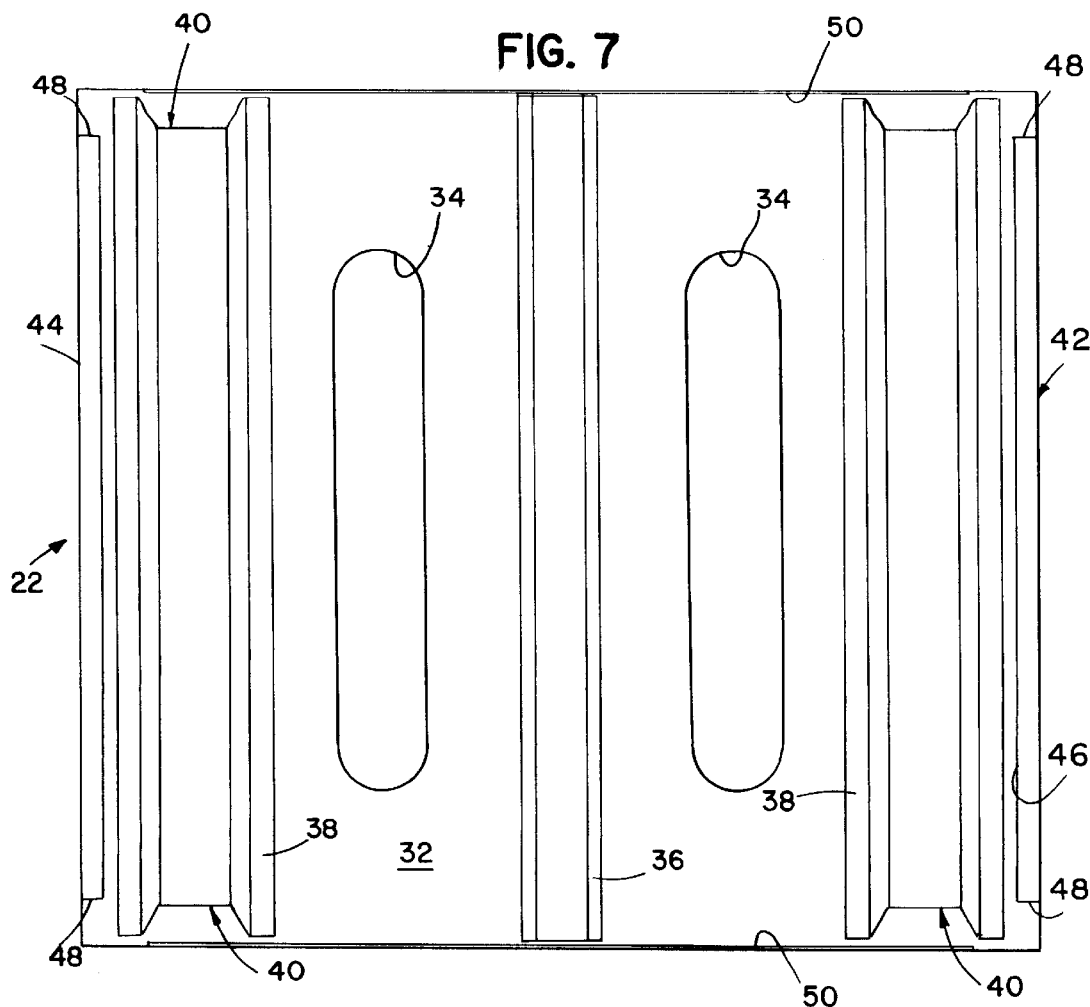
FIG. 7 is a bottom plan view of the top panel assembly, similar to FIG. 6, before being affixed to the frame's side wall assemblies.
Figure 8:
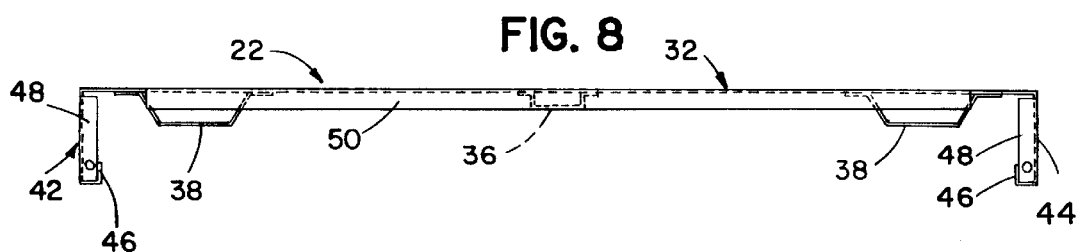
FIG. 8 is a front elevation view of the top panel assembly of FIG. 7.
Figure 9:
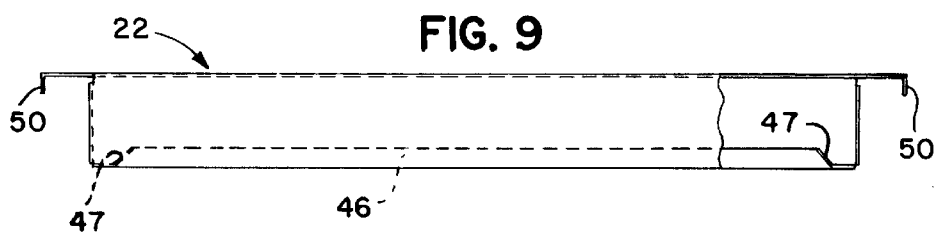
FIG. 9 is a side elevation view of the top panel assembly of FIG. 7.

As best seen in FIGS. 7–9, the corrugated support channel members 38 are formed as generally flat-bottomed, V-shaped trough members. They are specially cut at their respective ends to correspond to the central profile portion (described later herein) of the ends of each respective corrugated side channel member 28. That is, each end 40 of the top panel support members 38 (see FIGS. 6 and 7) closely fit to and are rigidly affixed (by welding) to the upper ends of the central profile of the corrugated side channel members 28. However, advantageously members 38 are not full corrugated members like side channels 28. This helps achieve a lower overall weight for frame 20, and permits the access openings 34 to be readily positioned at multiple different positions on top panel assembly 22.

The top panel member 32 of top assembly 22 is formed with front and rear drop edges 42, 44, each of which terminate in a return lip portion 46. The respective side ends of each front and rear drop edges 42, 44 terminate in bent-in edges 48. The return lip portions 46 each preferably terminate in a chamferred or angled-cut edge 47, so as to provide sufficient access for welding purposes during assembly. Further, top panel member 32 also has drop side edges 50 (see FIGS. 8 and 9). As will be noted (when comparing FIGS. 6 and 7), the front and rear drop edges 42, 44, and their bent-in end edges 48, terminate at a length less than the full side edge length of top panel 32. This allows the bent-in end edges 48 to be rigidly affixed (by welding) to the end flange lip portion 92 of the respective corrugated side channel members 28 (as described later herein).

In effect then, the top panel assembly 22 and the two side assemblies 26 are supported together as an integral welded up unit, i.e., thus initially strengthened against torsion and other twisting action by the respective corrugated top panel supports 38 and corrugated side channel members 28 along with the various rigid weld connections therebetween.

Figure 10:
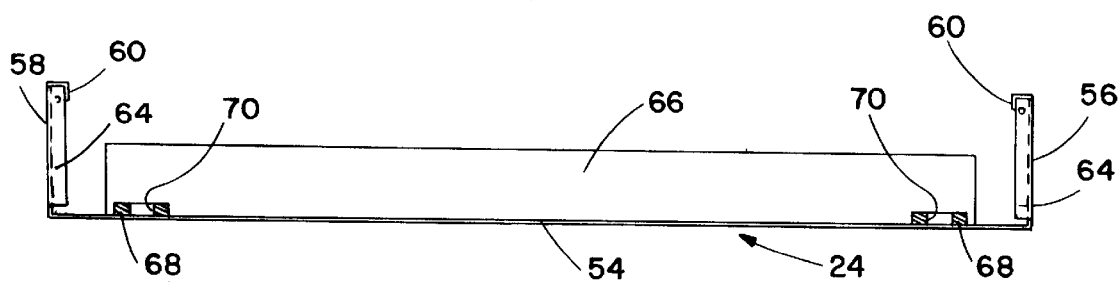
FIG. 10 is a front elevation view of the bottom panel assembly of FIG. 5, with portions broken away for better viewing.
Figure 11:
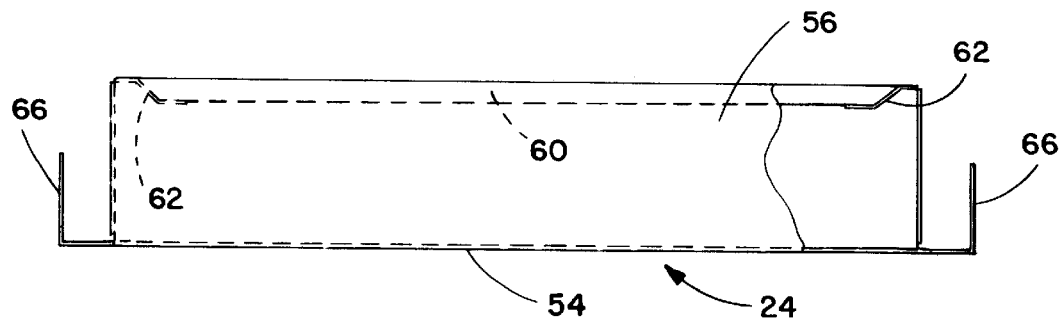
FIG. 11 is a side elevation view of the bottom panel assembly of FIG. 5.

Turning to the bottom panel assembly 24 (see FIGS. 5, and 10–11), it comprises a flat bottom panel member 54 (also preferably formed of 14 gauge sheet steel) which terminates at its respective front and rear edges in respective raised front and rear lip portions 56, 58, each having a return lip portion 60. The latter terminate at each end in chamferred or angled-cut ends 62, again for ease of access for welding during assembly. The front and rear raised lips 56, 58 terminate at their respective outer ends in bent-in edges 64. As seen in FIG. 5, and similar to what is done with the top panel assembly 22, the bent-in end edges 64 are rigidly fastened, by welding, to the lip portion 92 of end flange 90 of the respective corrugated side channel members 28 (as described later herein). Bottom panel member 54 also includes respective raised side edges 66. Four separate anchor plates 68, each having an opening 70, are welded to the bottom panel member 54. These anchor plates are used (with appropriate fasteners—not shown) to assist fastening the present electronic equipment frame 20 to floor members or other suitable floor support members (none shown).

Turning to FIG. 13, there is shown a representative cross strut assembly 30, which includes a cross strut support member 72, formed as a generally U-shaped channel member with side edges 74 each having a series of fastener holes 76. Importantly, rather than using a straight end extension member, the respective outer ends of each cross strut support member are formed with a bent tang portion 78. Such a bent tang end 78 helps, through use of a special offset joint with full fillet weld, as later described herein, to significantly rigidly connect the ends of each cross strut assembly 30 to the respective side channel supports 28. Additionally, as best seen in FIG. 14, each cross strut assembly 30 also includes a generally U-shaped stiffener support member 80 rigidly affixed (such as by spot welds generally depicted by reference letters SW), to the backside of the cross strut support 72. The stiffener support member 80 extends (see FIGS. 13 and 17) only along the central region or length of each cross strut member 72, i.e., designated as length A in FIG. 13. Thus, each stiffener support member 80 purposely spans (see FIGS. 5, 6, and 17) the entire distance between the respective inner end flanges 94 of each respective pair of corrugated side channel members 28 for a given side assembly 26. The end of each member 80 is then preferably welded to end flange 94 of each associated side channel 28, so as to provide yet additional resistance to torsion for the overall frame 20.

As best seen in FIG. 16, each respective corrugated side channel support member 28 (preferably formed of 11 gauge sheet steel) comprises a generally flat bottomed, V-shaped central corrugated portion or profile 82, as formed by the flat bottom wall 84 and respective V-walls 86. Further, each member 28 also has two outer side extension walls 88, one of which terminates in an outer end flange 90 having a bent-in lip 92, while the other wall terminates in the lipless inner end flange 94. The V-walls 86 extend at an angle of preferably approximately 120° to the bottom wall 84. There are formed along the length of the elongated corrugated side channel member 28 (see FIGS. 12 and 16) a series of notches 96, i.e., periodic cut-outs formed in the inner end flange wall 94. The notches 96 are used to accommodate assembly, i.e., insertion and weld fastening, of the respective cross strut assemblies 30 to the corrugated side channels 28.

Importantly, for overall maximum strength reasons, and other than the occasional presence of a respective notch 96, the respective outer and inner end flanges 90, 94 of each corrugated side channel 28 (see FIG. 16) extend to substantially the same length (i.e., as measured from the outer side extension walls 88). It will be noted that the depth of each cross strut member 72, and hence of each notch 96, is substantially less than, and preferably about only half of, the full length dimension of flange 94. Advantageously then, the central corrugated profile 82, along with the substantially equal length bent flanges 90 and 94, of the corrugated side channel member 28, allows such channel members 28 to provide significant strength, i.e., for both electronic equipment load support and against twisting.

Figure 18:
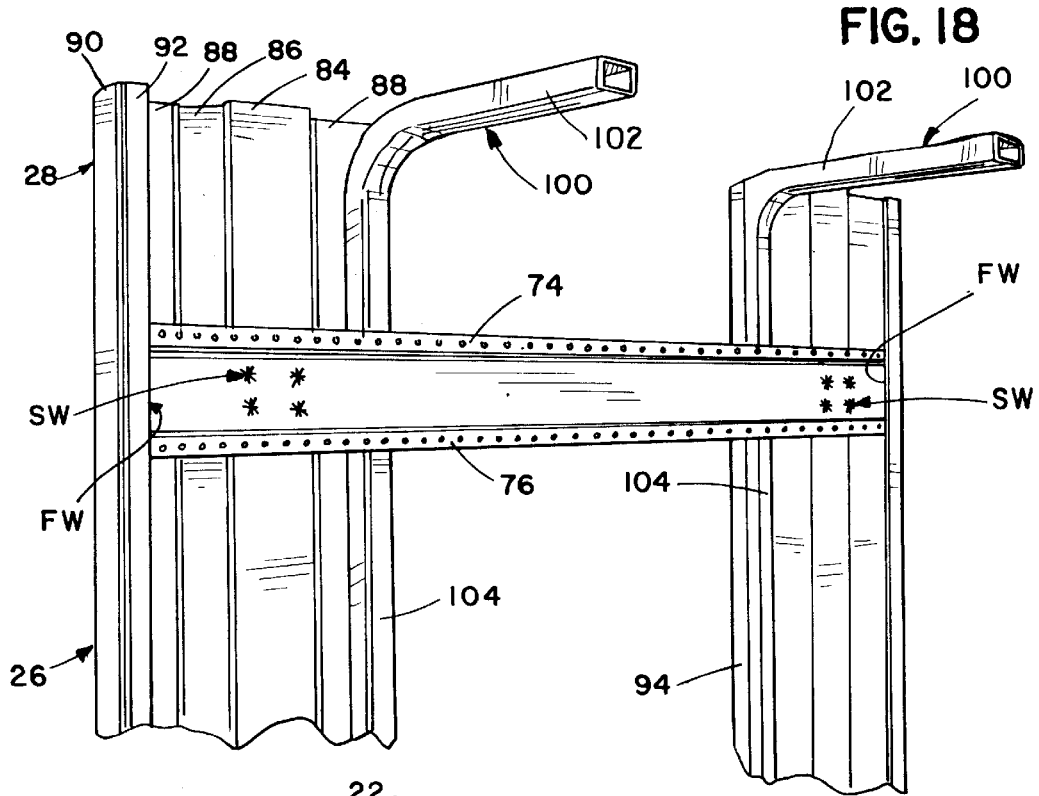
FIG. 18 is an enlarged fragmented perspective view of an upper inside corner of the frame of FIG. 1, depicting the L-shaped tubular frame components.

Further, through use of partial length notches 96 in an otherwise full length flange 94, the back side surface 77 (see FIGS. 15 and 17) of each cross strut member 72 can be forced against and welded to (see spot welds designated by reference letters SW in FIG. 18) the rear side of flat bottom wall 84 (of the side support channel 28). Importantly, such a bent configuration of tang end 78 allows use of a very heavy duty so-called offset joint with full fillet weld (generally designated by reference letters FW in FIG. 17). (Such an offset joint with full fillet weld is used instead of merely a butt-type joint with a lesser strength straight fillet weld, such as would be possible if only a non-bent tang end configuration for cross strut 72 were used.) Testing has indicated that use of such an offset joint with full fillet weld, instead of simply a butt-type joint and weld, significantly enhances the overall connection strength of cross strut assemblies 30 to the corrugated side channels 28, and thus the overall torsion and failure resistance capabilities of frame 20.

Thus, as seen in FIGS. 1–4, each side assembly 26 includes two respective corrugated side channel members 28 rigidly connected (by welding) by a plurality, i.e., preferably five, respective cross strut assemblies 30. The result is a side assembly 26 per se that is significantly rigid, and has various corrugated members (extending both vertically and horizontally) to provide the substantial strength needed against both twisting and diagonal racking of that side individual frame component. Thereafter, the overall welded connection (see FIG. 2) of the respective top panel assembly 22 and bottom panel assembly 24 to the two respective side assemblies 26 creates yet further substantial rigidity and earthquake-resistance for the overall electronic equipment frame 20.

However, the earthquake resistant capabilities of frame 20 are even further enhanced by the presence of a plurality of generally L-shaped bent tubing stiffener members 100, each of which has a general horizontal section 102 and a vertical section 104 (see FIGS. 1–6, and 17–19). Preferably stiffener tubes 100 are formed of approximately ⅝" square steel tubing, with a ⅛" thick wall. Thus, at the upper end of enclosure 20, a series of four such L-shaped stiffener tubes 100 are rigidly affixed by welding at several locations to provide additional resistance to twisting. That is (see FIGS. 2, 6, 18, and 19), each upper stiffener member 100 has its vertical portion 104 welded along the inside surfaces of both the inner flange end 94 and extension wall 88 (of corrugated side member 28). Similarly, the horizontal portion 102 of each one (of the 4) of upper stiffener members 100 is welded along corrugated support 38 and to top panel member 32 (FIG. 6).

Similarly, at the lower end of enclosure 20 (see FIG. 2, 3, 5, and 17), another series of four such L-shaped stiffener tubes are rigidly affixed by welding at several locations to also provide additional strength against twisting. That is, each lower stiffener member 100 (of 4 total) has its horizontal portion welded along the top surface of bottom panel 54, and also has its vertical portion welded along the inside surfaces of both the inner flange end 94 and the extension wall 88 (of the corrugated side member 28).

Preferably, the various vertical tube sections 104 extend at least twice the length of the horizontal tube sections 102. In one sample of the present invention, the vertical tube sections 104 extend a length of approximately 28 inches along the side assemblies 26, while the various horizontal tube sections 102 extend a length of approximately 8 inches along the respective top and bottom assemblies 22, 24.

Together, the various rigid weld connections of the numerous, i.e., preferably 4 top and 4 bottom, L-shaped tube stiffener members 100 help significantly increase the overall structural stability and rigidity of the frame 20, by further enhancing the rigid connections of the top panel assembly 22 to the two respective side assemblies 26, and of the bottom panel assembly 24 to the two side assemblies 26. It is believed that the addition of such rigidly connected (welded) tube stiffeners 100 helps provide bi-axial stress relief to the overall frame 20, and further, helps eliminate the need for any extra thick gauge steel to be used for side channel members 28, and for the top and bottom panel members 32, 54. This helps reduce the overall weight of frame 20. Tube stiffeners 100 also eliminate the need for any type extra corrugation (or other stiffener) member, (e.g., such as to join the lower ends of the respective side corrugated members across the bottom panel assembly 24.

It is further believed that the use of the present corrugated side channel support members having two full length flanges, i.e., where here the flange ends 90 and 94 are substantially the same length, rather than of substantially unequal lengths, helps greatly increase the support provided frame 20 by the respective side assemblies 26 against twisting and racking (e.g., under tremor forces from earthquakes and explosions). This substantial support provided by the side assemblies 26 is yet further greatly enhanced by the specific use of bent tang extension ends 78, coupled with use of the present heavy duty weld connection, i.e., of an offset joint with a full fillet weld FW. Notably, testing of a sample unit made without the presence of such bent tang extension ends 78, and without the associated offset joints with full fillet welds FW, resulted in a failure to pass the Seismic Zone 4 test. This then confirmed the importance of the same, along with the use of corrugated side channels having substantially equal length flange ends, i.e., for use with the present frame 20.

Figure 19:
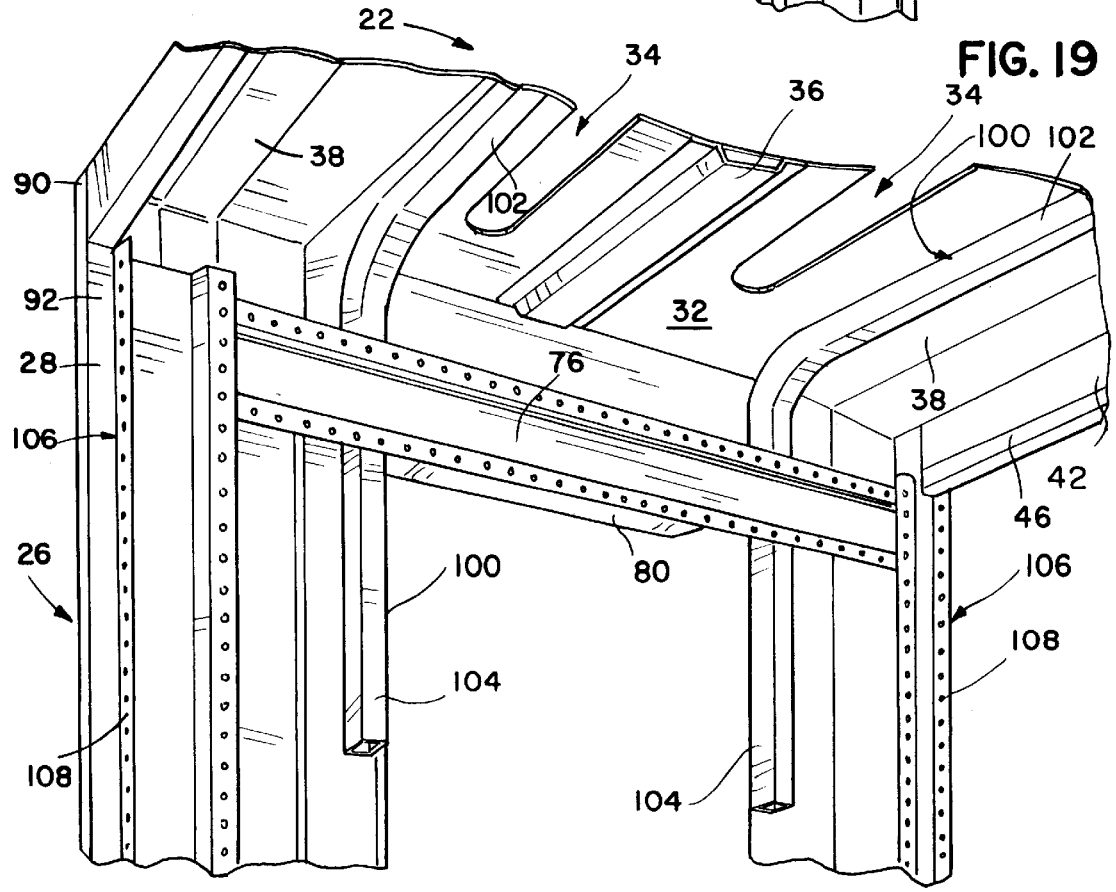
FIG. 19 is a completed assembly view, again in fragmented pespective, of the upper inside corner shown in FIG. 6, with the top panel assembly attached.

As seen in FIG. 19, mounting support plates 106 can be added to the frame 20 to provide a series of mounting holes 108 to which equipment shelves or actual electronic equipment modules can be mounted for use of frame 20.

Figure 20:
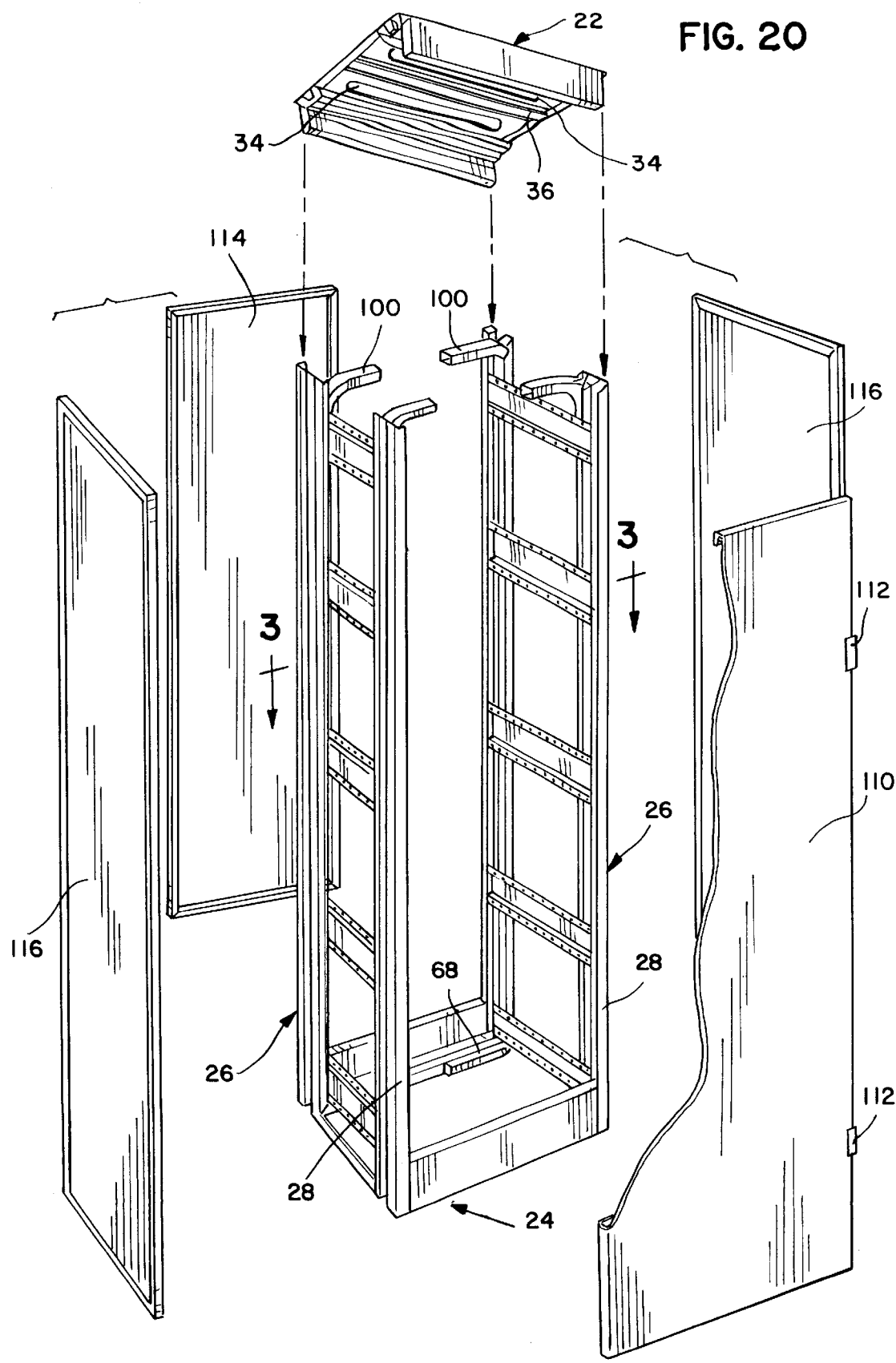
FIG. 20 depicts an alternate embodiment, in exploded assembly perspective view, of the present frame with the addition of front, rear and side panels, to create a full cabinet-type equipment enclosure based on the present frame.

FIG. 20 depicts an alternate embodiment of the above-described earthquake-resistant frame 20 of the present invention, which has been converted, when desired, into a full electronic equipment enclosure. This is done through the addition of a hinged front door 110, where hinges 112 can be affixed to the respective front face side channels 28, a rear door 114 which can be affixed or hinged as desired to the rear face side channels 28, and a pair of side cover panels 116 which are mounted to the respective sides of frame 20 (again via side channels 28). It will be understood, however, that the addition of doors 110, 114 and side cover panels 116 to frame 20 are not needed to achieve the frame's overall earthquake-resistant capabilities, rather such extra so-called "skins" only mount onto, i.e., hang onto, the frame 20.

As will be appreciated, when compared to prior art designs of earthquake-resistant enclosures, the present invention's design permits use of minimal material, and with minimum welds and assembly labor, thus making the frames of the present invention relatively economical to manufacture. Further, the present frame's open-type design, while still having superior vibration-resistant capabilities for earthquake purposes, also allows easy access to the front, rear, and importantly, through each side of frame 20. This easy access features allows electronic equipment units and shelves to be readily installed, adjusted, and removed. Further yet, the lightweight feature of the present frame, i.e., due to its minimal use of material, and hence its overall lower frame weight, when compared to prior art units, becomes quite advantageous when under vibration stress, i.e, seismic activity. That is, the less the total frame weight present, the better a frame is able to withstand seismic vibrations. Further, the present design, since there are no full sized corrugated support members (like side corrugated supports 28) used across the top panel assembly, allows placement of access and exhaust fan openings at numerous different locations. That option was not available with prior art earthquake resistant frames and enclosures.

From the foregoing, it is believed that those skilled in the art will readily appreciate the unique features and advantages of the present invention over previous types of earthquake-resistant frames and enclosures for electronic equipment. Further it is to be understood that while the present invention has been described in relation to a particular preferred embodiment as set forth in the accompanying drawings and as above described, the same nevertheless is susceptible to change, variation and substitution of equivalents without departure from the spirit and scope of this invention. It is therefore intended that the present invention be unrestricted by the foregoing description and drawings, except as may appear in the following appended claims.

We claim:

1. A frame apparatus for supporting electronic equipment against excessive vibration, comprising in combination, two respective side assemblies rigidly connected by a top panel assembly and a bottom panel assembly;

each said side assembly including at least two corrugated side channel members rigidly connected to one another by a plurality of cross strut members, each said corrugated side channel member having a configured profile comprising a flat-bottomed V-shaped central portion with substantially flat extension walls extending therefrom which walls respectively terminate in end flange members, said end flange members being of substantially equal length, one of said end flange members having a return lip portion, the other one of said end flange members being lipless and formed with a plurality of notches, and each said notch sized to accommodate insertion of a respective said cross strut member;

each said cross strut member formed of a channel profile and terminating at each outer end in a bent tang extension end, each said bent tang extension end rigidly affixed via an offset joint with a fillet weld to said return lip portion of the associated said corrugated side channel member;

two spaced apart top panel stiffener members rigidly affixed to said top panel assembly and having a profile complimentary to said profile of said central portion of said corrugated side channel members and rigidly affixed thereto;

a plurality of L-shaped bent tube stiffener members, with a first series of said bent tube members rigidly affixed to both said top panel assembly and said respective side assemblies, and a second series of said bent tube stiffener members rigidly affixed to both said bottom panel assembly and said respective side assemblies;

at least one access opening formed in said top panel assembly to permit access therethrough;

and a top panel stiffener channel rigidly affixed to said top panel assembly adjacent said access opening for supporting said top panel assembly adjacent said access opening.

2. The frame apparatus of claim 1, wherein a U-shaped stiffener channel member is rigidly affixed to each said cross strut member along the central portion thereof extending between the respective said lipless end flanges of said side channel members and rigidly affixed thereto.

3. The frame apparatus of claim 1, wherein said bent tube stiffener members comprise L-shaped square tube members each having both a horizontal portion and a vertical portion.

4. The frame apparatus of claim 3, wherein said vertical portion extends at least twice as long as said horizontal portion.

5. The frame apparatus of claim 4, wherein said V-shaped central portion of each said side channel member has a flat bottom wall and two angled walls, said angled walls extending at an angle of approximately 120° relative to said flat bottom wall.

6. The frame apparatus of claim 1, wherein that portion of said cross strut member extending through said notch is of a depth substantially less than the length of said lipless end flange of a said side channel member.

7. The frame apparatus of claim 1, wherein the depth of said notch is no greater than approximately half the length of said lipless end flange of said side channel member.

8. The frame apparatus of claim 1, wherein a plurality of anchor plates are fastened to said bottom panel assembly to permit fastening of said frame apparatus to associated floor supports.

9. The frame apparatus of claim 1, wherein at least one door panel is rigidly affixed to at least one said side channel member to cover off a front or rear face of said frame apparatus, and thereby create an equipment enclosure.

10. The frame apparatus of claim 9, wherein at least one side panel is affixed to one said side assembly to cover off a side face of said frame apparatus.

11. The frame apparatus of claim 1, wherein at least one mounting support plate is affixed to respective said side channel members to permit mounting of electronic equipment.

* * * * *